United States Patent
Frantz et al.

(10) Patent No.: US 9,806,208 B2
(45) Date of Patent: Oct. 31, 2017

(54) METHOD OF PASSIVATING AN IRON DISULFIDE SURFACE VIA ENCAPSULATION IN A ZINC SULFIDE MATRIX

(71) Applicant: The United States of America, as represented by the Secretary of the Navy, Washington, DC (US)

(72) Inventors: Jesse A. Frantz, Washington, DC (US); Jason D. Myers, Alexandria, VA (US); Colin C. Baker, Alexandria, VA (US); Jasbinder S. Sanghera, Ashburn, VA (US); Steven C. Erwin, Washington, DC (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/615,935

(22) Filed: Jun. 7, 2017

(65) Prior Publication Data
US 2017/0271531 A1 Sep. 21, 2017

Related U.S. Application Data

(62) Division of application No. 14/661,165, filed on Mar. 18, 2015, now Pat. No. 9,705,012.

(60) Provisional application No. 61/954,703, filed on Mar. 18, 2014.

(51) Int. Cl.
*H01L 31/0216* (2014.01)
*H01L 31/032* (2006.01)
*C23C 14/06* (2006.01)
*H01L 31/0384* (2006.01)
*H01L 31/0368* (2006.01)

(52) U.S. Cl.
CPC .... *H01L 31/02167* (2013.01); *C23C 14/0623* (2013.01); *H01L 31/032* (2013.01); *H01L 31/0368* (2013.01); *H01L 31/0384* (2013.01); *Y02E 10/50* (2013.01)

(58) Field of Classification Search
CPC ............... H01L 31/02167; H01L 31/18; H01L 31/0368; H01L 31/032
See application file for complete search history.

(56) References Cited

U.S. PATENT DOCUMENTS

| | | | | |
|---|---|---|---|---|
| 2003/0107099 | A1* | 6/2003 | La Vecchia | H01L 31/032 257/439 |
| 2007/0163635 | A1* | 7/2007 | Nasuno | H01L 31/068 136/252 |
| 2007/0264488 | A1* | 11/2007 | Lee | H01L 31/032 428/323 |
| 2009/0017605 | A1* | 1/2009 | Lee | B82Y 30/00 438/558 |

(Continued)

*Primary Examiner* — Golam Mowla
(74) *Attorney, Agent, or Firm* — US Naval Research Laboratory; Dawn C. Russell

(57) ABSTRACT

A method for passivating the surface of crystalline iron disulfide ($FeS_2$) by encapsulating it within an epitaxial zinc sulfide (ZnS) matrix. Also disclosed is the related product comprising $FeS_2$ encapsulated by a ZnS matrix in which the sulfur atoms at the $FeS_2$ surfaces are passivated. Additionally disclosed is a photovoltaic (PV) device incorporating $FeS_2$ encapsulated by a ZnS matrix.

18 Claims, 4 Drawing Sheets

(56) References Cited

U.S. PATENT DOCUMENTS

2011/0240108 A1* 10/2011 Law .................. B82Y 30/00
                                                136/255
2013/0129907 A1* 5/2013 Popa .................. B05D 1/02
                                                427/2.1

* cited by examiner

METHOD OF PASSIVATING AN IRON DISULFIDE SURFACE VIA ENCAPSULATION IN A ZINC SULFIDE MATRIX

PRIORITY CLAIM

The present application is a divisional of U.S. application Ser. No. 14/661,165, filed on Mar. 18, 2015, which claims the benefit of U.S. Provisional Application No. 61/954,703, filed on Mar. 18, 2014 by Jesse A. Frantz et al., entitled "Method of Passivating an Iron Disulfide Surface via Encapsulation in Zinc Sulfide." The entire contents of these applications are incorporated herein by reference.

BACKGROUND OF THE INVENTION

Field of the Invention

The present invention relates to passivating the surface of crystalline iron disulfide ($FeS_2$) by encapsulating it in crystalline zinc sulfide (ZnS). It also relates to $FeS_2$ encapsulated by ZnS in which the sulfur atoms at the $FeS_2$ surfaces are passivated. Additionally, this invention relates to a photovoltaic (PV) device incorporating $FeS_2$ encapsulated by ZnS.

Description of the Prior Art

Iron disulfide has great promise as an Earth-abundant material for PV applications. In a recent survey of 23 known semiconductor systems with potential as PV absorbers, $FeS_2$ ranked highest in potential annual electricity production based on known reserves and had the lowest extraction cost. Wadia et al., "Materials availability expands the opportunity for large-scale photovoltaics deployment," *Environ. Sci. Technol.*, 43, pp. 2072-2077 (2009). Its bandgap is 0.95 eV, high enough to result in a potential solar to electricity conversion efficiency similar to that of Si, but unlike Si, it has an exceptionally high absorption coefficient of $\alpha=6\times10^5$ cm$^{-1}$ resulting in a required thickness of <40 nm for >90% absorption (Ennaoui et al., "Iron disulfide for solar energy conversion," *Sol. Energ. Mat. Sol. Cells*, 29, pp. 289-370 (1993)) compared to typical thicknesses >100 μm for Si.

Despite these apparent advantages, $FeS_2$ PV devices have not yet lived up to their potential. Efficiency has been limited to approximately 3% due to open circuit voltage ($V_{OC}$) of <200 mV, only ~20% of the bandgap. Ennaoui et al., "Iron disulfide for solar energy conversion," *Sol. Energ. Mat. Sol. Cells*, 29, pp. 289-370 (1993) and Wilcoxon et al., "Strong quantum confinement effects in semiconductors: $FeS_2$ nanoclusters," *Sol. State Comm.*, 98, pp. 581-585 (1996). These limits have been shown to be the direct result of surface termination of $FeS_2$ crystals. Bulk $FeS_2$ crystallizes in the cubic pyrite structure, and its sulfur atoms are paired in an S—S bond ($S_2^{2-}$). Crystal surfaces, however, are typically terminated by S monomers ($S^{1-}$) that may convert to $S^{2-}$ through a redox reaction. Bi et al., "Air stable, photosensitive, phase pure iron pyrite nanocrystal thin films for photovoltaic application," *Nano Lett.*, 11, pp. 4953-4957 (2011) and Zhang et al., "Effect of surface stoichiometry on the band gap of the pyrite $FeS_2$(100) surface," *Phys. Rev. B*, 85, art. 085314 (2012). The resulting surface states exhibit a high density of defects within the $FeS_2$ bandgap and shows properties similar to the iron monosulfide phase, with a bandgap of approximately 0.3 eV. In PV devices, these surface states at films' surfaces and grain boundaries lead to high dark current and low $V_{OC}$.

BRIEF SUMMARY OF THE INVENTION

The aforementioned problems are overcome in the present invention which provides a method of passivating the surface of crystalline iron disulfide ($FeS_2$) by encapsulating it in crystalline zinc sulfide (ZnS), a product comprising $FeS_2$ encapsulated by ZnS in which the sulfur atoms at the $FeS_2$ surfaces are passivated, and a photovoltaic (PV) device incorporating $FeS_2$ encapsulated by ZnS.

To move beyond its current performance bottleneck, $FeS_2$ requires passivation of its surface states. The present invention provides a method of passivating surface defects in $FeS_2$ by encapsulating it in ZnS. A density-functional theory (DFT) study indicates that ZnS can create a defect-free interface with $FeS_2$. Experimental results indicate that surface defects in polycrystalline $FeS_2$ films are indeed passivated by encapsulation in ZnS.

The present invention has many advantages. It results in passivation of surface states in crystalline $FeS_2$, which is a feature that has not been shown with any other encapsulant. Using the method of the present invention, the $FeS_2$/ZnS interface can be made free of mid-gap states that are typically associated with S monomers at the $FeS_2$ surface. Also, this invention can be incorporated into a rigid or flexible PV device, making it possible to build efficient solar cells from an Earth-abundant material.

These and other features and advantages of the invention, as well as the invention itself, will become better understood by reference to the following detailed description, appended claims, and accompanying drawings.

BRIEF DESCRIPTION OF THE DRAWINGS

FIG. 2a is for $FeS_2$ encapsulated by a ZnS capping layer. FIG. 2b is for $FeS_2$ encapsulated by a ZnO capping layer. FIG. 2c is for $FeS_2$ encapsulated by a $SiO_2$ capping layer.

In FIG. 4a, the substrate is a rigid material. In FIG. 4b, the substrate is a flexible material.

DETAILED DESCRIPTION OF THE INVENTION

Figure 1:
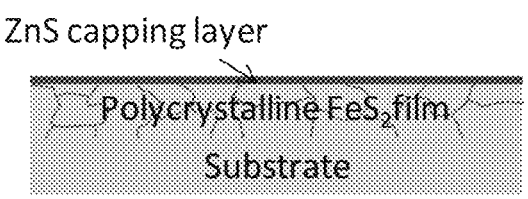
FIG. 1 shows a polycrystalline $FeS_2$ film encapsulated by coating it with a ZnS capping layer.

In one embodiment, $FeS_2$ is sputtered at room temperature from a single target in a partial pressure ($1\times10^{-5}$ T) of sulfur onto a glass substrate. The film was ~200 nm thick and polycrystalline. It exhibited the expected cubic pyrite crystal structure as indicated by X-ray diffractometry. The sample was transferred to an evaporation chamber without removal to atmosphere, and a 40 nm thick layer of epitaxial ZnS was deposited by thermal evaporation. A sketch of this sample is shown in FIG. 1. Transferring the sample between deposition chambers under vacuum, or without removal to air, avoids oxidation and contamination of the $FeS_2$ surface. In other embodiments, high substrate temperature deposition of $FeS_2$ may be carried out by sputtering from a multi-component target to a high temperature substrate (e.g., Ts=400° C.), and sulfurdizing under flowing $H_2S$ (e.g., at 500° C., for 5 hours). All vacuum-deposited fabrication is preferred according to some aspects of the invention.

Figure 2:
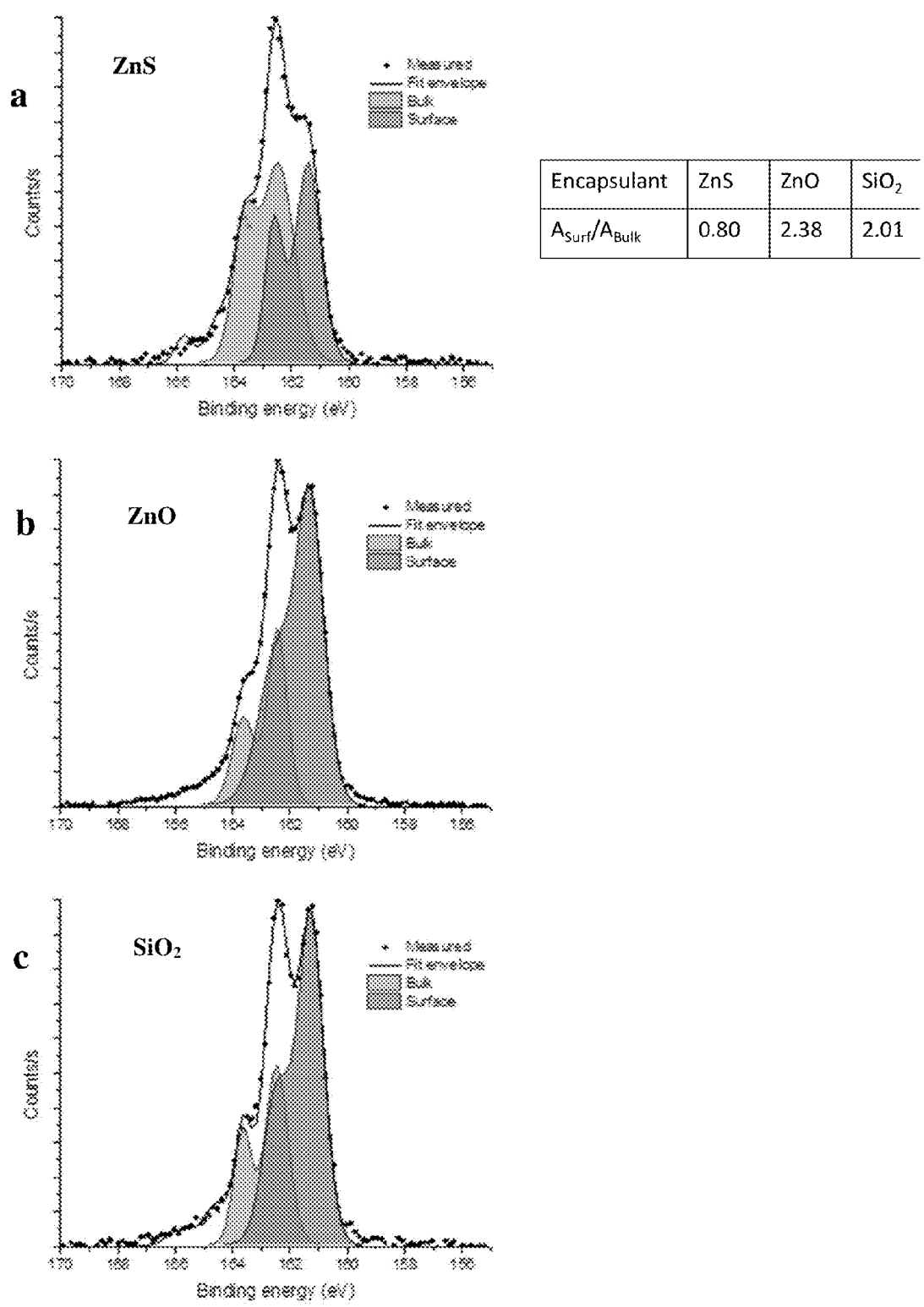
FIG. 2 shows XPS results comparing the S 2P peak.

Initial X-ray photoelectron spectroscopy (XPS) results for this sample were obtained and compared to results for bare $FeS_2$ and films with ZnO and $SiO_2$ encapsulation layers. The encapsulation layers were removed in steps inside an ultrahigh vacuum chamber with an ion beam, and XPS scans were carried out after each removal step. The results, shown in FIG. 2, compare the S 2p doublet of a bare film to those with capping layers. In each case a combination of S 2p doublets associated with both the bulk states and surface defects is present. The peak with lowest binding energy (near ~161 eV) is the S $2p_{3/2}$ component of the doublet and is associated with these surface defects. For both ZnO and $SiO_2$, this peak is stronger than the peak associated with the bulk states, indicating a larger concentration of surface defects, presumably $S^{2-}$. For the ZnS-capped sample, however, the defect peak is smaller relative to the bulk peak, indicating that the surface defects have been partially passivated. This is the first demonstration of passivation of $FeS_2$ surface defects by a ZnS capping layer.

Figure 3:
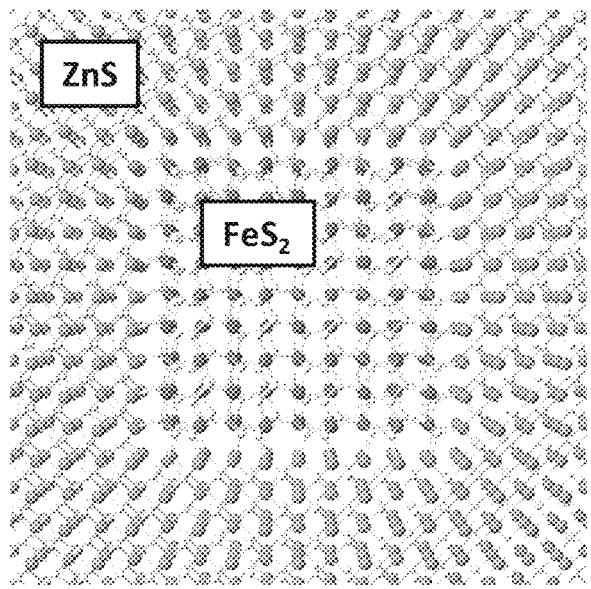
FIG. 3 shows the atomic structure of an $FeS_2$ nanocrystal embedded in a ZnS matrix, based on DFT results.

To obtain an atomic scale understanding of the bonding between $FeS_2$ and ZnS, DFT calculations were carried out. The $FeS_2$ and ZnS have a nearly perfect lattice match, with lattice spacings of 5.417 Å and 5.411 Å, respectively. Because of this the two materials can form a nearly defect-free interface. An illustration of an $FeS_2$ nanocrystal encapsulated in ZnS, based on DFT, is shown in FIG. 3.

Figure 4:
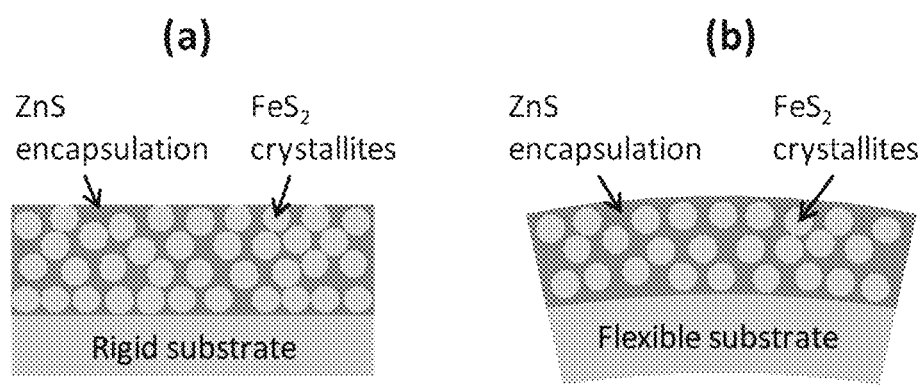
FIG. 4 shows $FeS_2$ crystallites encapsulated within a ZnS matrix.

Several other embodiments of the invention are shown in FIG. 4. In these cases, $FeS_2$ crystallites are encapsulated within a ZnS matrix. The $FeS_2$ crystallites may vary in size from 1 nm to 10 μm, and the ZnS separating $FeS_2$ crystallites is at least one monolayer thick. FIG. 4a shows an embodiment in which the substrate is a rigid material such as rigid glass or a semiconductor wafer; and FIG. 4b shows an embodiment in which the substrate is a flexible material such as polymer, flexible glass, or metal foil. In the latter case, the $FeS_2$ and ZnS matrix constitute a film that may flex along with the substrate.

Figure 5:
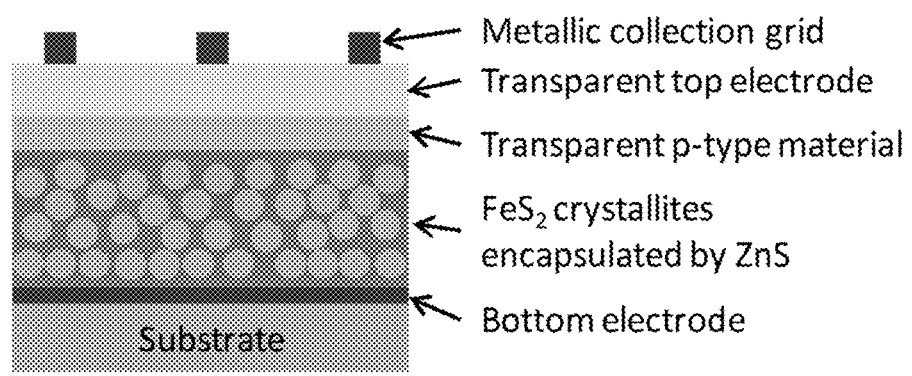
FIG. 5 shows $FeS_2$ crystallites encapsulated within a ZnS matrix being employed in a PV device.

In another embodiment, the film comprising $FeS_2$ crystallites encapsulated within a ZnS matrix is employed as the absorber in a PV device. One example of a suitable device architecture is shown in FIG. 5. In this example, the device comprises a substrate, a conductive bottom contact, the $FeS_2$ crystallites encapsulated within a ZnS matrix, a transparent p-type layer, a transparent conductive to serve as the top contact, and a metal grid that aids efficient charge collection. $FeS_2$ is typically an n-type semiconductor, so in this architecture, the transparent p-type layer is used in conjunction with the $FeS_2$/ZnS layer to form a p-n junction. Any other suitable PV device architecture, such as a Schottky junction device, could be used.

The $FeS_2$ crystallite size may vary from 1 nm to 10 cm. Individual crystallites may be in contact, as is the case in polycrystalline bulk samples or thin films, or crystallites may be separated with each entirely encapsulated in ZnS. The $FeS_2$ may be a natural or synthetic bulk sample.

The $FeS_2$ may be a film deposited by any suitable deposition technique. This technique may be any physical vapor, chemical vapor deposition, atomic layer deposition, or other suitable deposition process.

The ZnS may be a film deposited by any suitable deposition technique. This technique may be any physical vapor, chemical vapor deposition, or other suitable deposition process. The S content in $FeS_2$ could vary by up to ±20% from stoichiometry.

The Fe in $FeS_2$ could be partially substituted by Si with a ratio of up to 50%, i.e. $Fe_{1-x}Si_xS_2$ where x<0.5. The Zn in ZnS could be partially substituted by another metal including Ni, Mn, Cu, Ag, or Pb with a ratio of up to 50%. The S in ZnS could be partially substituted by Se or O with a ratio of up to 50%.

The above descriptions are those of the preferred embodiments of the invention. Various modifications and variations are possible in light of the above teachings without departing from the spirit and broader aspects of the invention. It is therefore to be understood that the claimed invention may be practiced otherwise than as specifically described. Any references to claim elements in the singular, for example, using the articles "a," "an," "the," or "said," is not to be construed as limiting the element to the singular.

What is claimed as new and desired to be protected by Letters Patent of the United States is:

1. A method for passivating iron disulfide crystallites, comprising:
    forming iron disulfide crystallites comprising crystal surfaces; and
    encapsulating the iron disulfide crystallites within an epitaxial zinc sulfide matrix;
    wherein the epitaxial zinc sulfide matrix passivates sulfur atoms present on the crystal surfaces of the iron disulfide crystallites, thereby reducing surface defects as compared to iron disulfide crystallites not encapsulated by an epitaxial zinc sulfide matrix.

2. The method of claim 1, further comprising placing the zinc sulfide matrix comprising encapsulated iron disulfide crystallites on a substrate.

3. The method of claim 2, wherein the substrate comprises a rigid material.

4. The method of claim 2, wherein the substrate comprises a flexible material.

5. The method of claim 4, wherein the epitaxial zinc sulfide matrix and encapsulated iron disulfide crystallites form a film that flexes along with the flexible substrate.

6. The method of claim 1, wherein the iron disulfide crystallites range in size from 1 nm to 10 μm.

7. The method of claim 1, wherein a layer of the epitaxial zinc sulfide matrix at least one monolayer thick separates the iron disulfide crystallites.

8. The method of claim 1, wherein the surface defects in the iron disulfide crystallites are assessed by comparing an X-ray photoelectron spectroscopy scan of S 2p doublets associated with surface defects with an X-ray photoelectric spectroscopy scan of S 2p doublets associated with the bulk state.

9. The method of claim 1, wherein the crystal surfaces of the iron disulfide crystallites and the epitaxial zinc sulfide matrix form a lattice match.

10. The method of claim 1, wherein the epitaxial zinc sulfide matrix comprises crystal surfaces having a lattice constant of about 5.411 Å.

11. The method of claim 1, wherein the crystal surfaces of the iron disulfide crystallites have a lattice constant of about 5.417 Å.

12. The method of claim 1, wherein the epitaxial zinc sulfide matrix is deposited by physical vapor deposition.

13. The method of claim 1, wherein the epitaxial zinc sulfide matrix is deposited by chemical vapor deposition.

14. The method of claim 13, wherein the chemical vapor deposition is atomic layer deposition.

15. The method of claim 1, wherein the iron disulfide crystallites are formed by physical vapor deposition.

16. The method of claim 1, wherein the iron disulfide crystallites are formed by chemical vapor deposition.

17. The method of claim 16, wherein the chemical vapor deposition is atomic layer deposition.

18. The method of claim 1, further comprising incorporating the passivated iron disulfide crystallites into a photovoltaic device.

* * * * *